United States Patent [19]

Odashima

[11] Patent Number: 5,183,969
[45] Date of Patent: Feb. 2, 1993

[54] ANISOTROPICALLY ELECTROCONDUCTIVE ADHESIVE AND ADHESIVELY BONDED STRUCTURE THEREWITH

[75] Inventor: Satoshi Odashima, Saitama, Japan

[73] Assignee: Shin-Etsu Polymer Co., Ltd., Tokyo, Japan

[21] Appl. No.: 770,975

[22] Filed: Oct. 1, 1991

[30] Foreign Application Priority Data

Oct. 5, 1990 [JP] Japan .................. 2-268147

[51] Int. Cl.$^5$ .............................................. H05K 1/14
[52] U.S. Cl. ........................ 174/88 R; 156/273.9; 252/512; 361/412
[58] Field of Search .................. 116/207, 335; 156/273.9, 292, 156/64, 182; 29/830; 428/913; 174/88 R; 252/512, 513, 514, 516, 518; 374/162; 359/265; 361/395, 412, 413, 386–389; 324/133, 158 R, 537

[56] References Cited

U.S. PATENT DOCUMENTS

| 3,995,964 | 12/1976 | De Groef | 174/88 R |
| 4,780,371 | 10/1988 | Joseph | 428/414 |
| 4,999,460 | 3/1991 | Sugiyama | 252/512 |
| 5,001,302 | 3/1991 | Atsumi | 174/94 R |
| 5,065,505 | 11/1991 | Matsubara | 252/512 |

*Primary Examiner*—Gerald P. Tolin
*Attorney, Agent, or Firm*—McAulay Fisher Nissen Goldberg & Kiel

[57] ABSTRACT

A device is proposed to detect firm and reliable adhesive bonding and electrical connection between electrode arrays on two circuit boards by sandwiching a layer of an anisotropically electroconductive adhesive composition, in which the adhesive composition is formulated with an epoxy resin capable of changing color by complete curing and at least one of the circuit boards is prepared of a substrate having an opening or made from a transparent material in the vicinity of the electrode array so as to facilitate visual see-through inspection of the adhesive layer to detect complete curing of the adhesive composition.

4 Claims, 2 Drawing Sheets

ANISOTROPICALLY ELECTROCONDUCTIVE ADHESIVE AND ADHESIVELY BONDED STRUCTURE THEREWITH

BACKGROUND OF THE INVENTION

The present invention relates to an anisotropically electroconductive adhesive used for forming an adhesively bonded structure for establishing electrical connection in electric and electronic circuit boards and the like as well as an adhesively bonded structure formed by using the adhesive.

It is well established in the prior art to use an anisotropically electroconductive adhesive for simultaneously obtaining adhesive bonding and electrical connection between a flexible printed circuit board, referred to as FPC hereinbelow, and a printed circuit board, referred to as PCB hereinbelow, between a FPC and a display panel such as a liquid-crystal display, referred to as LCD hereinbelow, plasma display, referred to as PDP hereinbelow, or electroluminescence display, referred to as EL hereinbelow, and the like, each circuit board and display unit being provided with an array of electrodes or terminals to be electrically connected with those in the counterpart.

It is very important in order to ensure high reliableness of the electric and electronic instruments to have a structure adhesively bonded together by using such an anisotropically electroconductive adhesive to give firm and reliable electrical connection between the terminal arrays. Several methods have been undertaken for the non-destructive testing of the electrical connection in the thus adhesively bonded structure including the conduction test, microscopic observation test of the deformation of the electroconductive particles dispersed in the adhesive matrix, measurement of the thickness of the adhesive layer and so on.

Since completeness of the electrical connection in the thus adhesively bonded structure heavily depends on the melting or curing condition of the adhesive resin, it is proposed that the anisotropically electroconductive adhesive is admixed with an irreversibly thermochromic pigment which serves to provide a means for obtaining the information on the highest temperature reached during the bonding works from the change in the color of the pigment.

None of the above described prior art methods, however, is satisfactory due to its own limitation. For example, the conduction test is applicable only when the assemblage work of the instrument has gone to a considerably high stage near to completion so that detection of incomplete electrical connection is sometimes too late to take a measure for remedy. The observation of the deformed conductive particles can be performed only by the use of a microscope. When the adhesive composition contains a heat-curable resinous ingredient, in particular, deformation of the conductive particles not always provides a direct indication of the condition of curing of the adhesive. The method of thickness measurement is an empirical method which is possible by knowing the statistical correlation between the thickness and probability of occurrence of incomplete connection so that reliableness of the method is sometimes unavoidably poor more or less. The method of using a thermochromic pigment is also defective because, while the thermochromic color change of the pigment takes place only as a result of the highest temperature which the temperature of the adhesive composition has reached regardless of the duration at such a temperature, curing of an adhesive composition is a result obtained only when the adhesive composition is kept at a certain temperature for a certain length of time. What is worse is that the thermochromic pigment in an adhesive composition sometimes acts as an impurity which may cause a decrease in the adhesive bonding strength.

SUMMARY OF THE INVENTION

The present invention accordingly has an object to provide a novel adhesive composition capable of establishing anisotropical electrical connection between terminal arrays, by which completion of the electrical connection can be visually detected without admixing the adhesive composition with additives detrimental against or not contributive to adhesive bonding and with high reliability by solving the above described problems in the prior art adhesives as well as to provide an adhesively bonded structure of circuit boards made by using the adhesive, in which completion of the adhesive bonding can be visually inspected.

Thus, the anisotropically electroconductive adhesive composition of the invention comprises, as a blend:

(a) an epoxy resin-based adhesive resin as a matrix which exhibits a change in color by curing; and (b) electroconductive fine particles dispersed in the matrix.

Further, the adhesively bonded structure of circuit boards according to the invention formed by using the above defined adhesive composition comprises, as an integral body:

(A) two circuit boards each having an array of electrode terminals facing the other, one or both of the boards being provided with an opening or made from a transparent material at least in the vicinity of the electrode terminals to facilitate see-through inspection therethrough; and (B) a layer of an adhesive between the arrays of electrode terminals on the circuit boards as formed by curing an adhesive composition comprising, as a blend, (a) an epoxy resin-based adhesive resin as a matrix which exhibits a change in color by curing, and (b) electroconductive fine particles dispersed in the matrix.

BRIEF DESCRIPTION OF THE DRAWING

FIGS. 1a, 1b and 1c each illustrate the adhesively bonded structure according to the invention as the first embodiment, of which FIG. 1a is a plan view, FIG. 1b is a cross sectional view as cut and viewed along the direction shown by the arrows Ib—Ib in FIG. 1a and FIG. 1c is a cross sectional view as cut and viewed along the direction shown by the arrows Ic—Ic in FIG. 1a.

FIGS. 4a and 4b illustrate the adhesively bonded structure according to the invention as the fourth embodiment, of which FIG. 4a is a plan view and FIG. 4b is a cross sectional view as cut and viewed along the direction shown by the arrows IVb—IVin FIG. 4a.

DETAILED DESCRIPTION OF THE PREFERRED EMBODIMENTS

Figure 1A:
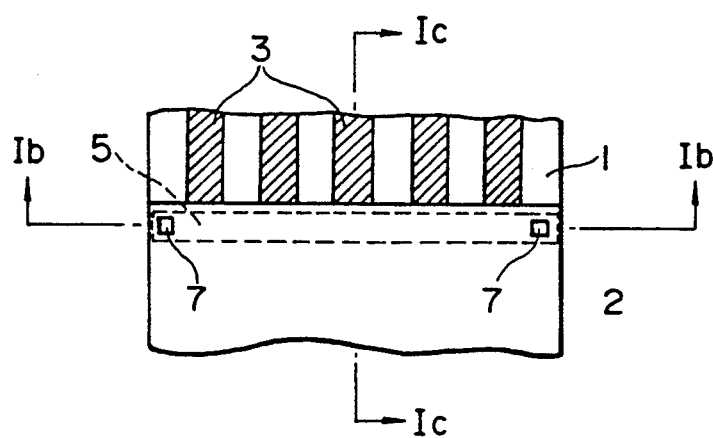

As is described above, the anisotropically electroconductive adhesive composition of the invention comprises, as the essential ingredients, (a) an epoxy-based adhesive resin which exhibits a change in color by curing to serve as a matrix of the composition and (b) fine particles of an electroconductive material to serve as the dispersed phase in the matrix of the composition. It is desirable that the color change in the epoxy-based adhesive resin taking place by curing is so clear that the color change of the adhesive layer on the circuit boards can be readily recognized by the visual see-through inspection even when the thickness of the adhesive layer is as small as a few $\mu$m to 10 $\mu$m. In this regard, it is desirable that the adhesive resin should exhibit a color change before and after curing ranked in the second or first class in the grey scale for standardization of color changes specified in JIS L 0804-1983 or, in other words, the color difference $\Delta E_{AN}$ in the adhesive resin before and after curing is at least 16 according to the Adams-Nickerson's color difference formula.

The extent of the color change by curing is dependent not only on the types of the epoxy polymer as the principal ingredient in the adhesive resin composition but also on the types of the curing catalyst as well as the concentration of the reactive groups in these ingredients as a total. Examples of the curing catalysts include polyamide-polyamine-based compounds, aromatic polyamine compounds, imidazole compounds, tetrahydrophthalic anhydride and the like. The epoxy-based adhesive compositions compounded with these curing catalysts are usually pale yellow to light brown in color before curing but exhibit a color change into deep brown by curing. These curing catalysts are used preferably absorbed in a molecular sieve or in the form of microcapsules because it is desirable that the curing catalyst pertains to the curing reaction only under heating with compression. The epoxy-based adhesive resin can be liquid, pasty or solid without particular limitations.

The epoxy polymer as the principal ingredient of the epoxy-based adhesive resin composition is not particularly limitative provided that each molecule has a plural number of epoxy groups. It is sometimes advantageous that the epoxy polymer is used as a combination with a thermoplastic resin in respect of the adhesive bonding strength and easy handling. An example of preferable polymer blends is a mixture of 100 parts by weight of an epoxy resin with 10 to 1000 parts by weight or, more preferably, 50 to 200 parts by weight of a synthetic rubber such as butadiene-acrylonitrile copolymeric rubbers and styrene-butadiene copolymeric rubbers.

The material of the electroconductive fine particles to serve as a dispersed phase in the above described epoxy-based adhesive resin is not particularly limitative including various metals and alloys such as nickel, solder alloys, gold, silver, palladium and the like, various types of carbon and electroconductive ceramics such as tungsten carbide and the like. In addition, particles of non-electroconductive materials such as ceramics and plastic resins can be used when the particle surface is coated or plated with a metal. The particles have an average diameter, preferably, in the range from 2 to 50 $\mu$m. The amount of the electroconductive fine particles compounded with the epoxy-based adhesive resin is in the range from 0.5 to 30% by weight based on the total amount of the anisotropically electroconductive adhesive composition.

It is optional according to need that the above described anisotropically electroconductive, epoxy resin-based adhesive composition is further compounded with various kinds of known additives including curing accelerators, vulcanizing agents, curing modifiers, aging retarders, heat-resistance improvers, thermalconductivity improvers, tackifiers, softners, various kinds of coupling agents, metal sequestrants and the like each in a limited amount.

In the following, an illustrative description is given of the adhesively bonded structure of the invention formed by utilizing the above described specific anisotropically electroconductive, epoxy resin-based adhesive composition such as printed circuit boards connected together.

Figure 1B:
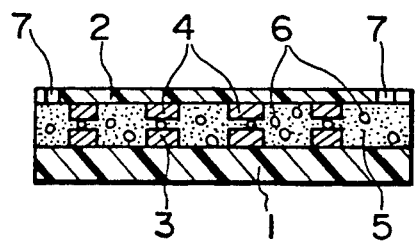
Figure 1C:
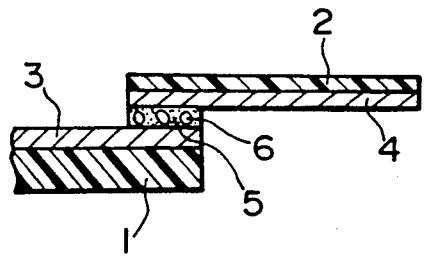

FIGS. 1a, 1b and 1c illustrate a first embodiment of the inventive structure, of which FIG. 1a is a plan view and FIGS. 1b and 1c are each a cross sectional view as cut and viewed along the directions shown by the arrows Ib—Ib and Ic—Ic, respectively, in FIG. 1a. The adhesively bonded structure comprises: a first circuit board 1 such as a printed circuit board made from an epoxy resin-impregnated laminate of glass fiber cloth and having electrode terminals or lines 3 in an array, a second circuit board 2 such as a polyimide resin FPC having an electrode terminals or lines 4 in an array and a layer 5 of an anisotropically electroconductive, epoxy resin-based adhesive composition containing electroconductive particles 6 dispersed in the matrix layer of the adhesive composition. One of the circuit boards 1, 2 or the second circuit board 2 in this case is provided with several openings or windows 7 in the vicinity of the electrodes 4 so as to enable see-through visual inspection of the adhesive layer 5 therethrough.

The adhesively bonded structure illustrated in FIGS. 1a to 1c can be formed by coating the surface of one or both of the circuit boards 1,2 having the electrode arrays with the adhesive composition to form the adhesive layer 5 followed by joining together the two circuit boards 1,2 with matching of the electrode arrays 3,4 and pressing under heating so as to cure the epoxy resin-based adhesive composition. Since the adhesive layer 5 is under see-through inspection through the openings 7 in the FPC 2, the proceeding of the curing reaction of the epoxy resin can be easily monitored by visual inspection of the color change caused in the adhesive layer 5. Namely, complete curing of the adhesive layer 5 as detected through the openings 7 can be an index for the firm and reliable electrical connection between the electrode arrays 3,4 through the electroconductive particles 6 dispersed in the adhesive layer 5 and sandwiched between the electrodes 3,4 on the two circuit boards 1,2.

Figure 2:
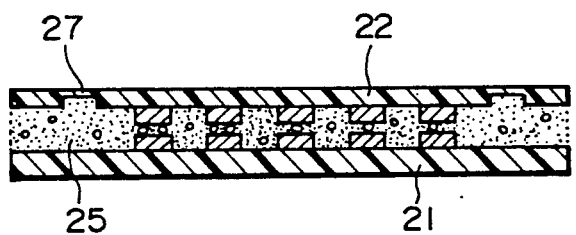
FIGS. 2 and 3 are each a cross sectional view, similar to FIG. 1b, of the adhesively bonded structure according to the invention as the second and third embodiments, respectively.
Figure 3:
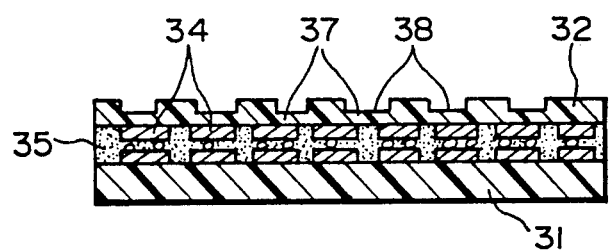

FIGS. 2 and 3 each illustrate the adhesively bonded structure of the invention as the second and third embodiments, respectively, by a cross sectional view similar to FIG. 1c, in which, as compared with the first embodiment illustrated in FIGS. 1a to 1c, a modification is effected in the second circuit board 2. In the embodiment illustrated in FIG. 2, namely, the substrate of the FPC 22 made from a translucent or semi-transparent material has, instead of being provided with several openings 7 shown in FIG. 1b, has a decreased thickness in several spot areas 27. The thickness of the substrate in these spot areas 27 is so small that the substrate of the FPC 22 is almost transparent to enable see-through inspection therethrough and proceeding of the curing reaction in the adhesive layer 25 can be readily monitored or detected by the visual inspection of the color change thereof through these spot areas 27 as the window to ensure firm adhesive bonding and hence reliable electrical connection between the circuit boards 21,22.

In the third embodiment illustrated in FIG. 3 by a cross sectional view, the substrate, which is made also from a translucent or semi-transparent material, is provided, in place of thin-walled spot areas 27 in FIG. 2, with parallel line grooves 38 at a regular pitch to form thin-walled see-through line windows 37 which enable monitoring of proceeding of the curing reaction taking place in the adhesive layer 35. When the thin-walled line windows 37 are arranged in parallel to the electrode lines 34 on the other surface of the substrate, it is important that the width of each window 37 and the arrangement pitch of the windows 37 are selected so as to avoid such a relative disposition that each of the thin-walled line windows 37 is just above one of the electrode lines 34 so that the adhesive layer 35 can hardly be inspected see-through through the thin-walled line windows 37.

Figure 4A:
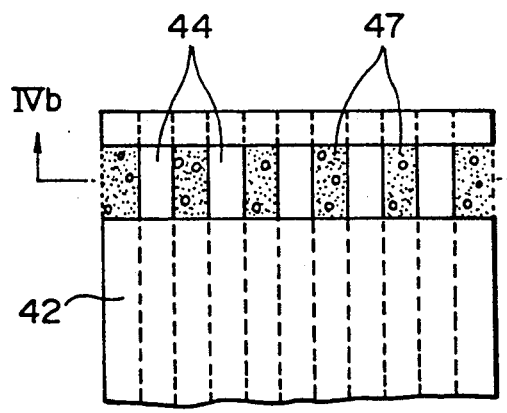
Figure 4B:
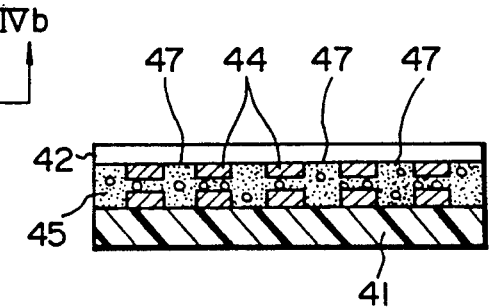

FIGS. 4a and 4b illustrate a fourth embodiment of the adhesively bonded structure of the invention by a plan view and a cross sectional view, respectively, in a manner similar to FIGS. 1a and 1b for the first embodiment. Instead of forming openings 7 in one and other spots as is illustrated in FIGS. 1a and 1b, the substrate of the FPC 42 is partly removed in a belt-like area running in the direction perpendicular to the electrode array 44 so that the electrode array 44 is exposed bare in this belt-like area and the adhesive layer 45 can be seen in the areas 47 between the electrodes 44 in the thus exposed portions so as to enable visual monitoring of proceeding of the curing reaction in the adhesive layer 45 by the color change.

Although the above described embodiments of the adhesively bonded structure of the invention are formed by using the second circuit board 2, 22, 32 or 42 of which the substrate is provided with open windows or is made from a translucent material and provided with thin-walled see-through windows, it is of course optional that the substrate per se is made from a highly transparent material such as a glass plate or polyethylene terephthalate film so that the adhesive layer 5, 25, 35 or 45 can be easily inspected even without providing see-through windows. The electrodes 4, 24, 34 or 44 can be formed either from a transparent electroconductive material such as indium-tin oxide by the method of vapor deposition or from an opaque material such as metals by a procedure of plating.

In view of the working efficiency, it is preferable that the anisotropically electroconductive adhesive composition used in the invention is shaped beforehand in the form of a film having an appropriate thickness. The method for forming a film of such a composition is well known in the art. For example, the adhesive composition dissolved or dispersed in an organic solvent is applied to a separator sheet followed by drying and peeling off the separator sheet to give a dried film of the adhesive composition. It is of course optional that the adhesive composition as dissolved or dispersed in an organic solvent is directly applied or sprayed to the circuit board in the areas including the electrode array to be electrically connected with the electrode array on the counterpart circuit board followed by evaporation of the solvent.

The above mentioned organic solvent should desirably be inert to the epoxy-based adhesive resin not to initiate the curing reaction of the resin at room temperature. Further, the drying treatment should be performed at a temperature not to cause curing reaction of the epoxy resin under air stream or in vacuum. Suitable separator sheet includes films of a fluorocarbon resin or PET films surface-treated with a silicone-based releasing agent.

In the following, examples are given to illustrate the invention in more detail.

EXAMPLE 1

An adhesive composition was prepared by uniformly dissolving or dispersing 100 parts by weight of an SBR having carboxyl groups at the molecular chain ends, 30 parts by weight of an alkylphenol-based tackifier, 60 parts by weight of a bisphenol A-based liquid epoxy resin, 30 parts by weight of a microcapsule-type imidazole-modified curing agent for epoxy resins as disclosed in Japanese Patent Kokai 64-70523 and 20 parts by weight of a phenolic resin powder, of which the particles double-plated with silver and gold had an average particle diameter of 10 $\mu$m and 95% by weight of the particles had a diameter falling between 8 and 12 $\mu$m, in a 8:2 by volume mixture of toluene and methyl ethyl ketone in such a proportion that the content of non-volatile matter in the resultant adhesive composition was 30% by weight.

The above prepared adhesive composition was applied to the surface of a film of polytetrafluoroethylene resin followed by drying under air stream to give a pale yellow film of the dried adhesive composition having a thickness of 25 82 m. This adhesive film turned reddish brown by curing and the color difference before and after curing was graded at class 1 with $\Delta E_{AN}$ of at least 32 in the grey scale for discoloration.

Separately, a polyimide resin film having a thickness of 75 $\mu$m (Upirex S, a product by Ube Kosan Co.) was laminated with a copper foil having a thickness of 35 $\mu$m and an FPC was prepared therefrom by patterning the copper foil by etching into an array of line electrodes each having a width of 0.1 mm arranged at a pitch of 0.2 mm followed by tin-plating in a thickness of 4 $\mu$m. This FPC was adhesively bonded together with a glass substrate plate having a conductive layer of indium-tin oxide (ITO) over the whole area to have a surface conductivity of 300 ohm by sandwiching the above prepared adhesive film therebetween under the conditions including the pressure of 30 kg/cm$^2$, length of time of 30 seconds and a curing temperature of 140° C., 170° C. or 190° C.

When the curing temperature was 140° C., no color change was noted in the adhesive layer indicating insufficient curing of the epoxy-based adhesive resin and no electrical connection could be obtained between the electrodes on the FPC and ITO-plated glass substrate. When the curing temperature was 170° C. or 190° C., a change in color was clearly noted in the adhesive layer from pale yellow to reddish brown indicating that curing of the epoxy resin was complete. The electrical resistance between the electrodes on the FPC and the ITO-plated glass substrate was 2.6 ohm or 2.3 ohm at the highest and 2.2 ohm or 2.0 ohm on an average for the curing temperatures of 170° C. and 190° C., respectively.

EXAMPLE 2

Two circuit boards were adhesively bonded together into an adhesively bonded structure as shown in FIGS. 1a to 1c by using the adhesive film prepared in Example 1. The first circuit board 1 was a printed circuit board made from an epoxy resin-impregnated glass fiber cloth laminate and the second circuit board 2 was a polyimide film-based FPC. The heat sealing was conducted under the same conditions as in Example 1 to prepare adhesively bonded structures in three different ways relative to the curing temperature. The adhesive film 5 could be visually inspected through the openings 7 formed in the end portions of the polyimide-based FPC 2.

When the curing temperature was 140° C., no color change was noted in the adhesive layer indicating insufficient curing of the epoxy-based adhesive resin and no electrical connection could be obtained between the opposite electrodes on the two circuit boards. When the curing temperature was 170° C. or 190° C., color change was clearly noted in the adhesive layer from pale yellow to reddish brown indicating that curing of the epoxy resin was complete. The electrical resistance between the opposite electrodes on the two circuit boards was 0.39 ohm or 0.38 ohm at the highest and 0.32 ohm or 0.31 ohm on an average for the curing temperatures of 170° C. or 190° C., respectively.

What is claimed is:

1. An adhesively bonded structure of circuit boards formed by using an anisotropically electroconductive adhesive composition which comprises, as an integral body:
   (A) two circuit boards each having an array of electrode terminals facing the other, one or both of the circuit boards having means for visual inspection of the electrode terminals; and
   (B) a layer of an adhesive between the arrays of electrode terminals on the circuit boards as formed by curing an adhesive composition comprising, as a blend,
      (a) an epoxy resin-based adhesive resin as a matrix containing a catalytic effective amount of a curing catalyst selected from the group consisting of polyamide-polyamine based compounds, aromatic polyamine compounds, imidazole compounds, tetrahydrophthalic anhydride, and which exhibits a change in color by curing, and
      (b) electroconductive fine particles dispersed in the matrix.

2. The structure of claim 1 wherein the visual inspection means is an opening in at least one of the boards.

3. The structure of claim 1 wherein the visual inspection means constitutes at least one board being transparent.

4. An anisotropically electroconductive adhesive composition which comprises, as a blend:
   (a) an epoxy resin-based adhesive resin as a matrix containing a catalytic effective amount of a curing catalyst selected from the group consisting of polyamide-polyamine based compounds, aromatic polyamine compounds, imidazole compounds, tetrahydrophthalic anhydride, and which exhibits a change in color by curing; and
   (b) electroconductive fine particles dispersed in the matrix.

* * * * *